United States Patent
Paquin

(10) Patent No.: US 7,624,555 B2
(45) Date of Patent: Dec. 1, 2009

(54) MOBILE AND MODULAR SENSITIVE COMPARTMENTED INFORMATION FACILITY SYSTEM

(76) Inventor: Bruce Paquin, 973 Sandstone Dr., Orange Park, FL (US) 32065

( * ) Notice: Subject to any disclaimer, the term of this patent is extended or adjusted under 35 U.S.C. 154(b) by 256 days.

(21) Appl. No.: 11/258,751

(22) Filed: Oct. 26, 2005

(65) Prior Publication Data

US 2006/0101750 A1 May 18, 2006

Related U.S. Application Data

(60) Provisional application No. 60/622,306, filed on Oct. 26, 2004.

(51) Int. Cl.
*E04C 2/08* (2006.01)
(52) U.S. Cl. .................. 52/783.1; 52/794.1
(58) Field of Classification Search ............. 52/143, 52/27.5, 29, 31, 36.1, 79.5, 79.6, 145, 309.8, 52/309.9, 204.1, 474, 479, 764, 796.1, 144, 52/379, 453, 716.5, 716.2, 716.7, 239, 783.1, 52/783.17, 794.1; 174/370, 377, 366, 369; 181/284, 30, 198
See application file for complete search history.

(56) References Cited

U.S. PATENT DOCUMENTS

| | | | | |
|---|---|---|---|---|
| 3,215,225 A * | 11/1965 | Kirschner | ................... | 181/290 |
| 3,871,153 A * | 3/1975 | Birum, Jr. | ................... | 52/794.1 |
| 3,949,827 A * | 4/1976 | Witherspoon | ............... | 181/284 |
| 3,992,835 A * | 11/1976 | Saveker | ...................... | 52/220.2 |
| 4,115,655 A * | 9/1978 | Prentice | ...................... | 174/368 |
| 4,487,793 A * | 12/1984 | Haines et al. | ............... | 428/136 |
| 4,534,141 A * | 8/1985 | Fagnoni | .......................... | 52/68 |
| 4,672,779 A * | 6/1987 | Boyd | .......................... | 52/79.4 |
| 4,786,543 A * | 11/1988 | Ferm | ............................ | 428/138 |
| 4,806,703 A * | 2/1989 | Sims | ........................... | 174/35 |
| 4,974,377 A * | 12/1990 | Dominitz et al. | ............. | 52/143 |
| 5,009,043 A * | 4/1991 | Kurrasch | ...................... | 52/145 |
| 5,063,098 A * | 11/1991 | Niwa et al. | ................... | 428/76 |
| 5,204,496 A * | 4/1993 | Boulay et al. | ............... | 174/355 |
| 5,210,984 A * | 5/1993 | Eckel | ........................... | 52/79.5 |
| 5,665,447 A * | 9/1997 | Greaves et al. | ................ | 428/68 |
| 5,864,991 A * | 2/1999 | Burns | ............................ | 52/67 |
| 5,893,244 A * | 4/1999 | Magoon | ...................... | 52/235 |
| 5,965,851 A * | 10/1999 | Herreman et al. | ........... | 181/200 |
| 6,119,422 A * | 9/2000 | Clear et al. | ................ | 52/309.8 |
| 6,121,545 A * | 9/2000 | Peng et al. | ................... | 174/377 |
| 6,604,328 B1 * | 8/2003 | Paddock | ..................... | 52/93.1 |
| 6,689,451 B1 * | 2/2004 | Peng et al. | ............... | 428/294.7 |
| 6,820,388 B2 * | 11/2004 | Newhouse et al. | ......... | 52/223.7 |

(Continued)

*Primary Examiner*—Richard E Chilcot, Jr.
*Assistant Examiner*—Alp Akbasli
(74) *Attorney, Agent, or Firm*—Timothy M. Barlow

(57) ABSTRACT

A modular SCIF includes a frame made from a plurality of prefabricated channels, and a plurality of prefabricated wall and ceiling panels that are attached to the frame. The frame, channels and panels are meet a set of standard dimensions. The SCIF fits within most offices and dwellings. The modular SCIF includes a prefabricated door and doorframe that are attached to the modular SCIF. The SCIF is attached directly to a concrete floor, the floor of a vehicle or to a track system. The panels include several layers, including a core layer of expanded metal and two layers of acoustic board. Additional layers include two layers of ABS plastic sheet, two layers of mass loaded vinyl sheet, two layers of galvanized steel sheet, and two layers of aluminum sheet. The additional layers may be used singly or collectively.

12 Claims, 5 Drawing Sheets

U.S. PATENT DOCUMENTS

| | | | |
|---|---|---|---|
| 6,823,643 B2 * | 11/2004 | France | 52/786.1 |
| 6,944,917 B2 * | 9/2005 | Yanagita et al. | 24/292 |
| 7,117,645 B2 * | 10/2006 | Bzorgi | 52/79.5 |
| 7,180,225 B2 * | 2/2007 | Sashida et al. | 310/330 |
| 7,181,891 B2 * | 2/2007 | Surace et al. | 52/642 |
| 7,188,635 B2 * | 3/2007 | Johnson | 135/87 |
| 7,204,065 B2 * | 4/2007 | Naji | 52/741.1 |
| 2004/0231914 A1 * | 11/2004 | Thompson et al. | 181/284 |
| 2005/0023937 A1 * | 2/2005 | Sashida et al. | 310/348 |
| 2006/0048640 A1 * | 3/2006 | Terry et al. | 89/36.02 |

* cited by examiner

MOBILE AND MODULAR SENSITIVE COMPARTMENTED INFORMATION FACILITY SYSTEM

PRIORITY DATA

This application is a claims priority from U.S. patent application Ser. No. 60/622,306 filed on Oct. 26, 2004, entitled "SCIF Construction System and Method" and is hereby incorporated by reference.

FIELD OF THE INVENTION

This invention relates generally to the field of Sensitive Compartmented Information Facilities (SCIFs), and more specifically to mobile and modular SCIFs for vehicles, stand alone units, new construction and retrofitting existing structures.

BACKGROUND OF THE INVENTION

SCIFs are becoming increasingly popular and important in this age of secure communications. A SCIF (Sensitive Compartmented Information Facility) provides a place where a person can speak freely without fear of eavesdropping on his or her phone or computer. Discretion is the key. Currently, there is only one known way to make a SCIF. This is per the Director of Central Intelligence Directive 6/9 (DCID 6/9) and Joint Air Force Army Navy (JFAN). This method requires that a dedicated, purpose-built structure or room within a structure be built to meet the requirements of the SCIF. This process is time-consuming and expensive. In addition, the process typically requires a building permit from an appropriate authority. This further adds to the time requirement and eliminates any secrecy from the SCIF construction process. This destroys the discretionary aspects of the SCIF. The whole world knows that you have a SCIF.

What is needed is a way to build a SCIF using far less time, money and using smaller work crews than is currently known. Additionally, construction of the new SCIF should not require a building permit, thus enhancing security and discretion.

It is intended that any other advantages and objects of the present invention that become apparent or obvious from the detailed description or illustrations contained herein are within the scope of the present invention.

SUMMARY OF THE INVENTION

The Mobil and Modular SCIFs come in a number of sizes to suit the needs of all users. The SCIF may be made in any size to meet user requirements, but may also be made in several standard sizes to meet demand quickly and cheaply. A small standard size is 43 inches by 72 inches by 4 feet interior measurement. One or more extensions can be included with all models to extend the SCIF to the customer's desired length. Models can be adapted for use on a pickup truck up to an 18 wheeler.

Much of what is disclosed here does not require a building permit. This is because the user is building a room within a room or a wall covering within a room. In all cases the system can be taken down or disassembled and moved to a new location for installation. This is not known in the prior art. In the traditional SCIF-build, the SCIF stays when you move. SCIFs are not cheap to build and can take up to 9 months to be completed. The construction can be a disruption in the work environment.

A modular SCIF includes a frame made from a plurality of prefabricated channels, and a plurality of prefabricated wall and ceiling panels that are attached to the frame. The frame, channels and panels all meet a set of standard dimensions. The SCIF fits within most offices and dwellings. The modular SCIF includes a prefabricated door and doorframe that are attached to the modular SCIF. The Mobile Modular SCIF comes in two versions. One is attached directly to a concrete floor, and the second is a stand alone version with a floor as part of the construction.

The Mobile Modular SCIF and the Retrofit SCIF system are constructed with panels which include several layers of material, including a core layer of expanded metal and two layers of acoustic board. Additional layers include two layers of ABS plastic sheet, two layers of mass loaded vinyl sheet, two layers of galvanized steel sheet, and two layers of aluminum sheet. The additional layers may be used singly or collectively.

The following is a discussion and description of the preferred specific embodiments of this invention, such being made with reference to the drawings, wherein the same reference numerals are used to indicate the same or similar parts and/or structure. It should be noted that such discussion and description is not meant to unduly limit the scope of the invention.

Figure 1C:
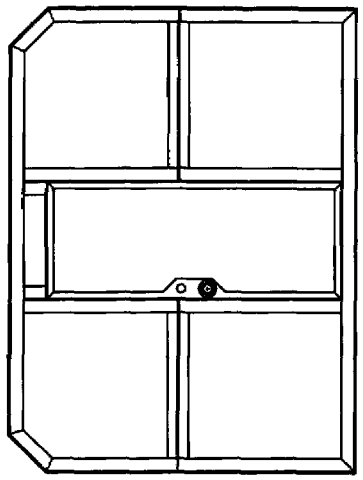
FIGS. 1a-1c show a front frame for a modular SCIF construction system, according to the present invention.

The following is a discussion and description of the preferred specific embodiments of this invention, such being made with reference to the drawings, wherein the same reference numerals are used to indicate the same or similar parts and/or structure. It should be noted that such discussion and description is not meant to unduly limit the scope of the invention.

DETAILED DESCRIPTION OF THE INVENTION

Referring now to the drawings, the attached figures illustrate a modular SCIF construction system for both stationary and mobile SCIFs.

Figure 1B:
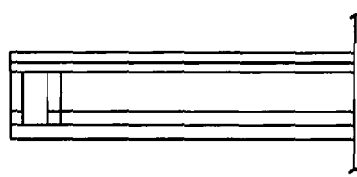
Figure 1A:
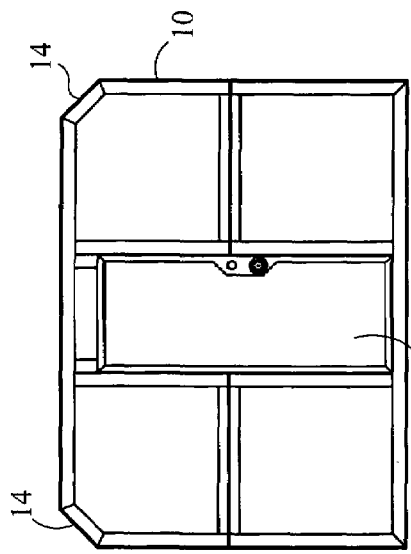

FIGS. 1a-1c show a front frame for a modular SCIF construction system, according to the present invention. FIG. 1a shows a front view of the front frame 10. All frames are made from a plurality of channels, such as U-, C-, and H-shaped aluminum or fiberglass channels, herein referred to as C-channels. Two or more C-channels can be combined, at various angles, to create components for the prefabricated frame. These straight pieces can be welded or riveted together at the corners, or alternatively, the channels may be attached to preformed corner components. Such construction makes the frames rigid enough for the intended purpose, and easy to transport and carry into a house or other structure. Note that the front frame 10 includes a door 12 which is built to the same standards as the rest of the SCIF. The upper corners 14 are angled instead of being squared. This enables to SCIF to be built to a single or a few standard sizes to accommodate standard rooms, despite the variations from the standard room sizes. This keeps the costs low and the time required for construction quite short. Of course, all corners can be squared if desired. The SCIF is not intended to be a structural element inside the existing building or dwelling. Thus, no construction permit is required in many cases. A short construction time, combined with no construction permit, means that the modular SCIF is truly a discrete location for sensitive communications.

Figure 2C:
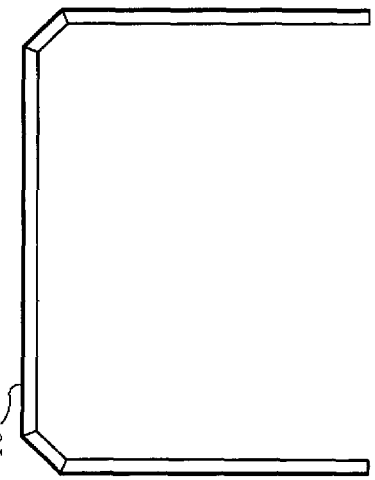
FIGS. 2a-2c show a center frame for the modular SCIF construction system, according to the present invention.
Figure 2B:
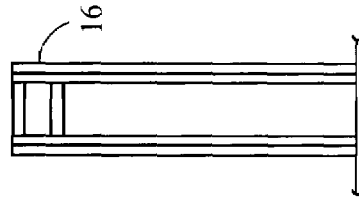
Figure 2A:
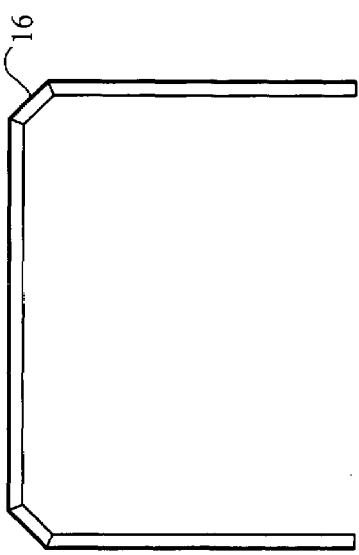
Figure 3A:
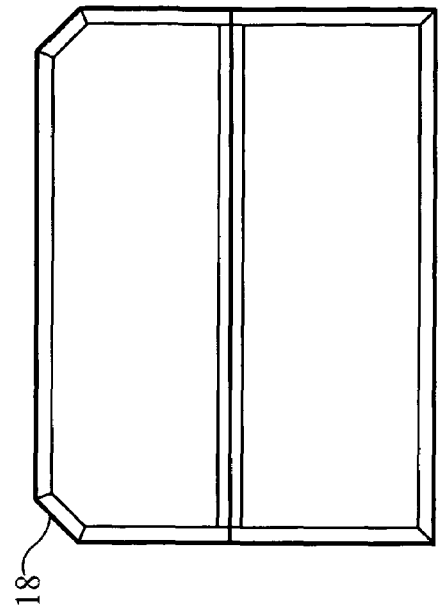
FIGS. 3a-3c show a back frame for the modular SCIF construction system, according to the present invention.
Figure 3B:
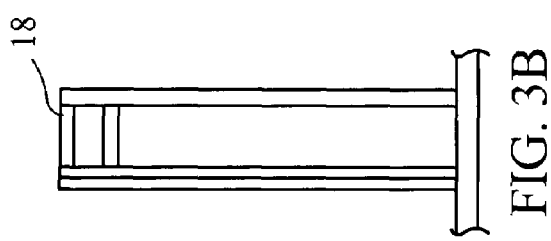
Figure 3C:
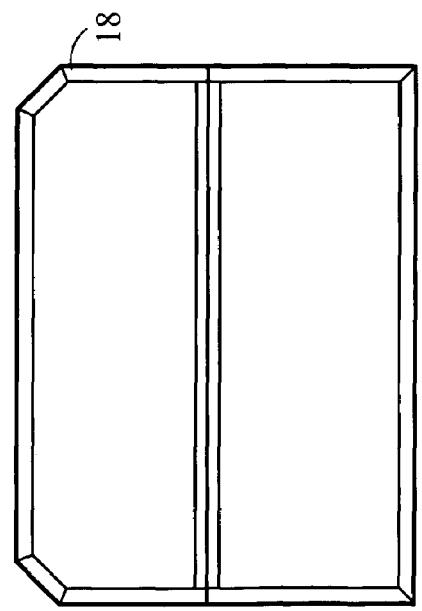

FIGS. 2a-2c show a standard extension 16, which can be stacked between a front frame 10 and a back frame 18 (see FIGS. 3a-3c). The various C-channels are arranged with the opening of the "C" parallel to the direction of the panels 20 (see FIG. 8). Thus, a SCIF builder secures a frame section 10, 16, 18 in place and then simply slides a prefabricated panel 20 into the channels. When the channels for a particular section 10, 16, 18 are filled, the builder caps off that section with an extension 16, a front frame 10, or a back frame 18. The C-channels of the newest section fit neatly over the exposed ends of the panels 20, and overlap with the other C-channels so that the channels can be joined to form a unitary frame.

The Mobile Modular SCIF comes in a number of standard sizes to suit the needs of all users. The SCIF may be made in any custom size to meet user requirements, but may also be made in several standard sizes to meet demand quickly. The interior measurement for a typical small standard size is 43 inches by 72 inches by 4 feet. One or more standard two-foot extensions can be included with all models to extend the SCIF to the customer's desired length. The smallest model can be adapted for use on a full size pickup truck. Many models can be adapted for use on virtually any type of truck or motor vehicle.

There are two basic standard-dimension Mobile Models: 8'×8'×8' and 12'×8×'8', exterior measurement, and with the use of the 2-foot extensions the Mobile Models can be as long as the customer desires. In addition, with the use of an adapter, which is 12'×8'×2', the customer can mix and match the two sizes to create the desired configuration. A man trap is easily created when the adapter is added to the 12'×8'×8 section and an end cap 10, 18.

The Mobile Modular SCIFs disclosed above can be modified to be attached to a concrete floor. This is accomplished by extending the walls of the unit and deleting the floor construction The walls are then attached to a framework of U channel attached to the floor. The U channel itself was attached to the floor prior to the Mobile Modular SCIF. This is a rail or track system. The rail or track system can be constructed in an existing room, warehouse space or on a slab inside or outside.

Figure 4A:
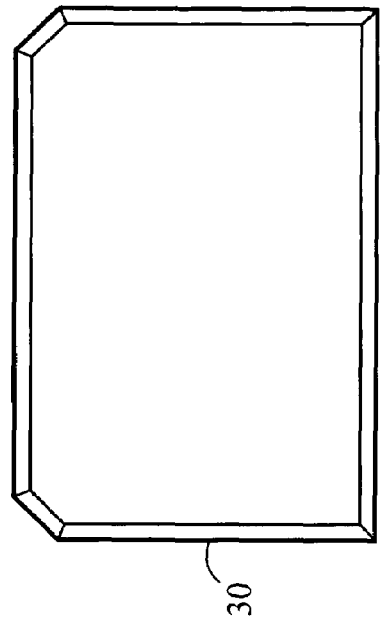
FIGS. 4a-4c show a front frame for a mobile SCIF construction system, according to the present invention.
Figure 4B:
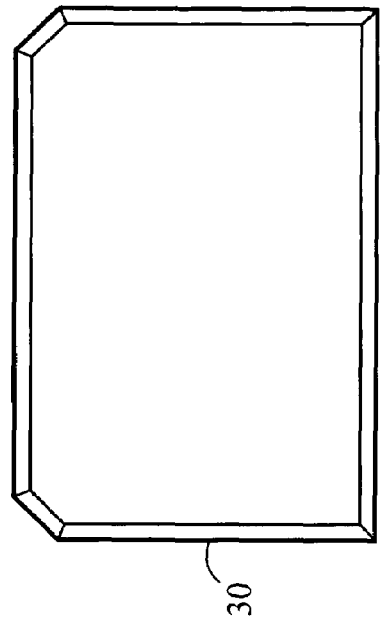
Figure 4C:
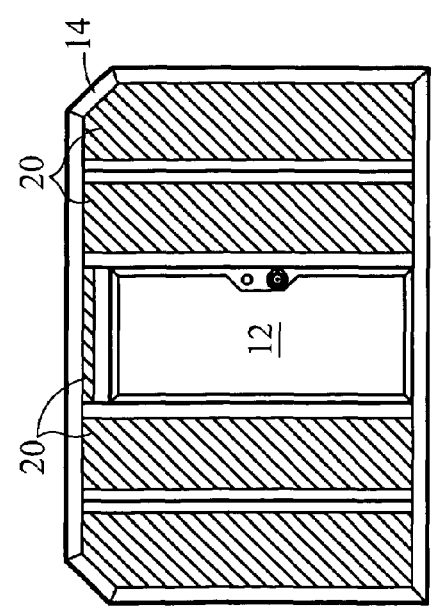
Figure 5A:
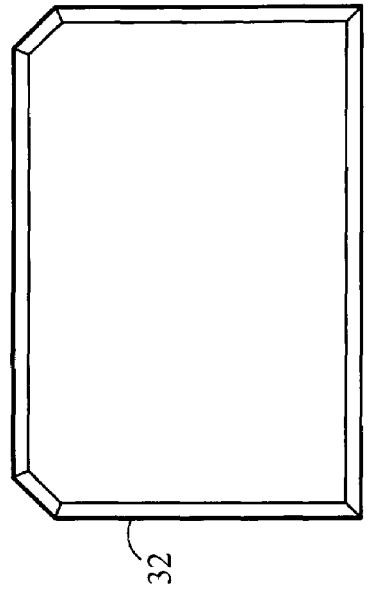
FIGS. 5a-5c show a center frame for the mobile SCIF construction system, according to the present invention.
Figure 5B:
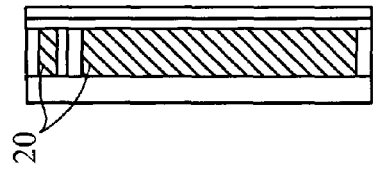
Figure 5C:
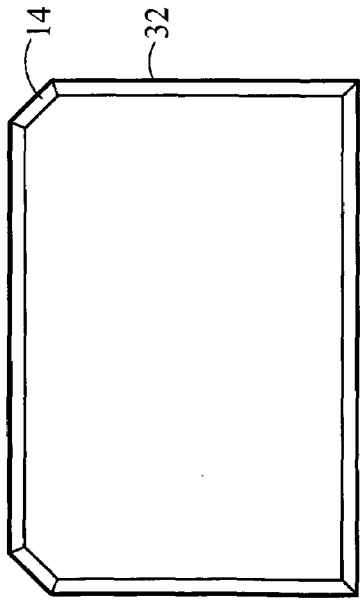
Figure 6A:
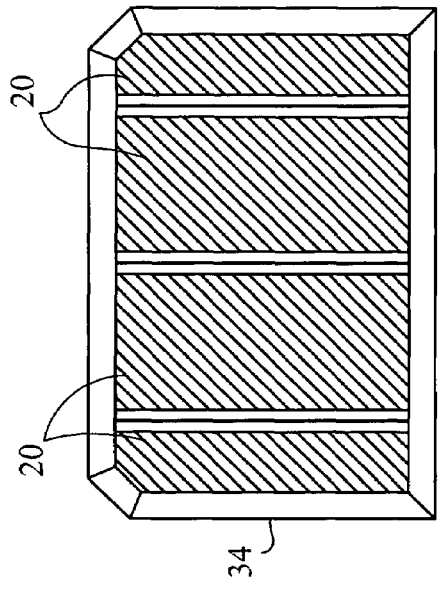
FIGS. 6a-6c show a back frame for the mobile SCIF construction system, according to the present invention.
Figure 6B:
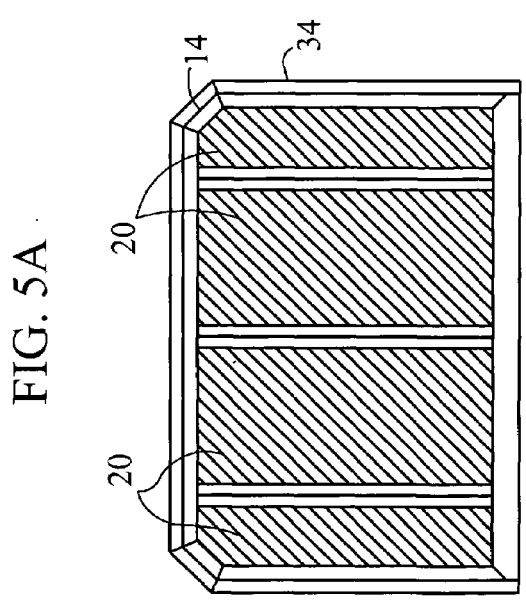
Figure 6C:
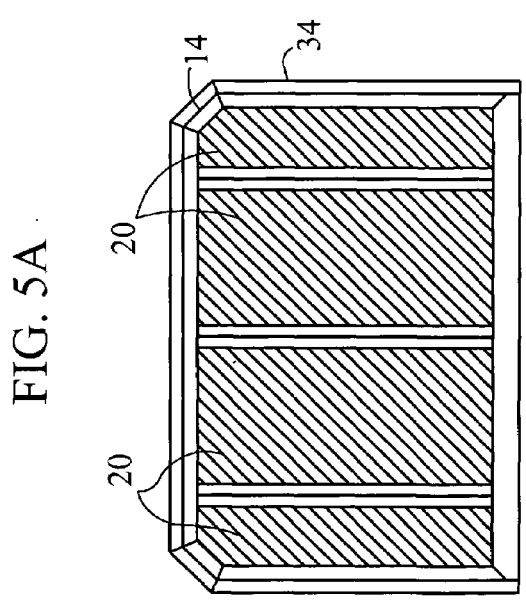

FIGS. 4-6 show some of the components of a mobile, modular SCIF system. FIGS. 4a, 4b, and 4c show a front, side and rear view, respectively, of a front mobile section 30. FIGS. 5a, 5b, and 5c show a front, side and rear view, respectively, of a mobile extension section 32. FIGS. 6a, 6b, and 6c show a front, side and rear view, respectively, of a rear mobile section 34.

Figure 7:
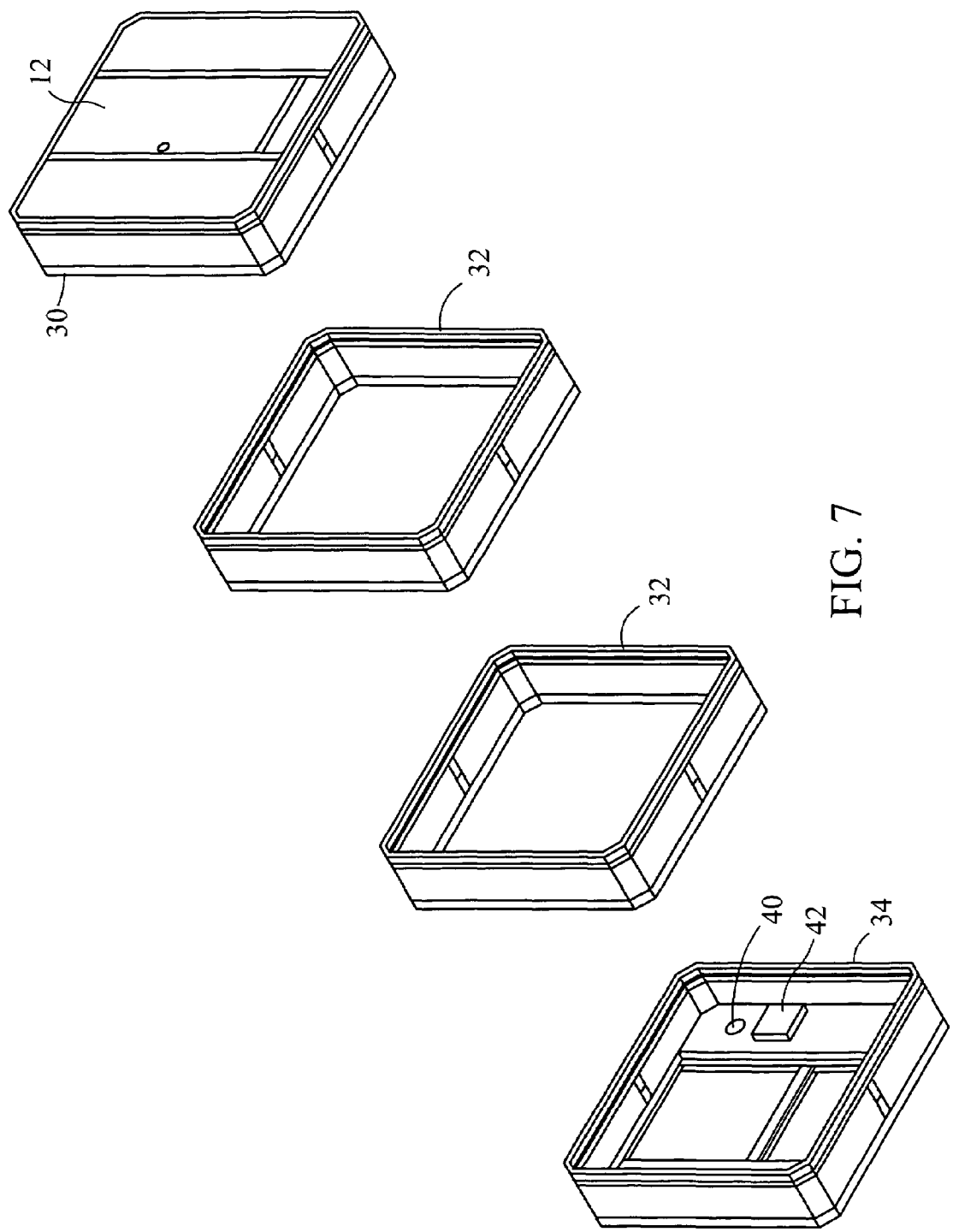
FIG. 7 shows a frame arrangement for the modular SCIF construction system, according to the present invention.

FIG. 7 shows a front end cap 30 with two extensions 32 and a rear end cap 34. The system is completely modular and can be built to the unique size and layout desired.

Construction of the Mobil and Modular SCIFs:

The Mobil SCIF starts out with a skeleton of metal channels or Pultruded fiberglass and end caps. Next, the panel material is cut and inserted into the skeleton.

The panels 20 that are inserted into the skeleton are made of several layers of material. These layers include a sheet of 0.025" aluminum, a sheet of 26 gauge galvanized steel sheet metal, ⅛ inch Mass Loaded Vinyl, ⅛ inch ABS plastic, 1 inch acoustic board and a core of expanded metal, either 9 Gauge Steel or 0.125 Aluminum. The layers are repeated out ward from the expanded metal, making a panel that is about 2⅞ inches thick.

The panel material is cut to size and inserted into the channel material. The sections are capped off on one side with an H channel having an EMI gasket material. This EMI gasket can be made of Neoprene rubber to make it weather-tight, and includes two strips of twisted metal for EMI protection The end caps 10,18,30,34 are made in the same way. The front end cap 10,30 has a door 12. The back end cap has air conditioner vents 40 and electrical input 42 with all other necessary wires (communication cable, computer cables, video cables, etc.)

The structural elements are connected together using either turnbuckles or cam locks. In the case of the Mobile Modular stand alone, there are three attachment points on each wall and ceiling, but not the floor when using turn buckles. When using cam locks the floor would include the attachment points.

The rail/track system attachment points for the sections are on the two side walls and the ceiling. The sections are then attached to the rail/track U channel by spot TIG welding the Aluminum channel about every 6 inches.

Construction of the Retrofit SCIF:

Panels

Figure 8:
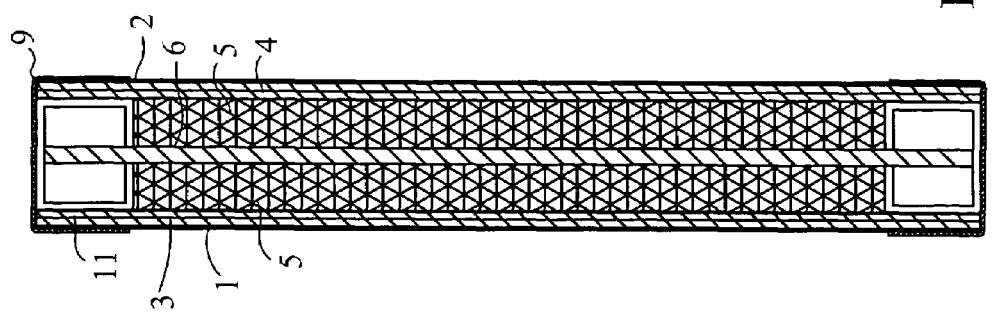
FIGS. 8 and 9 show a cross section of a door panel for the modular SCIF construction system, according to the present invention.
Figure 9:
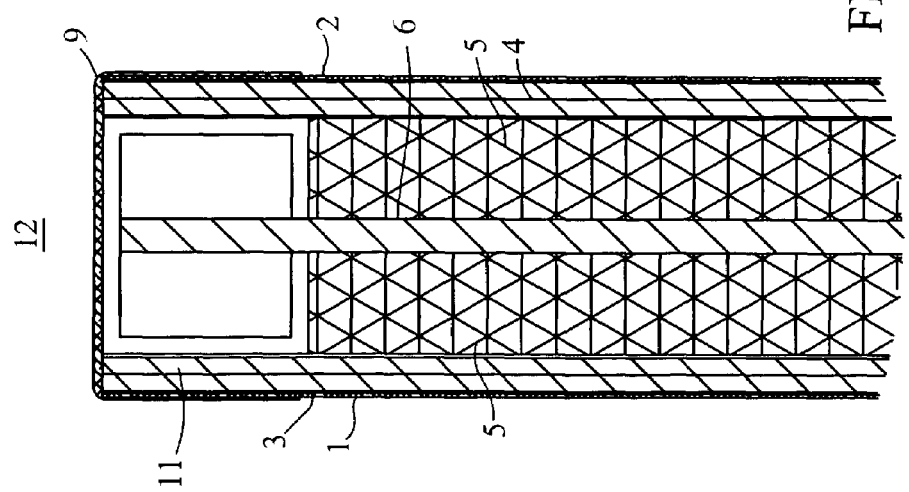

FIG. 8 shows a cross section of a door 12. The panels 20 are made of with the exception of the square channel 11 and the end cap 9, the construction of the panels 20 is the same as the door 12. The panels and doors are a sandwich of common materials. A core of expanded metal 6, such as 9 gauge steel or 0.125" aluminum, is sandwiched by 1-inch acoustic boards 5, such as Johns Manville Whispertone 6 lb. acoustic panel. Next, the acoustic board is covered with ⅛ inch ABS sheet 4. The ABS is covered with ⅛ inch mass loaded vinyl 3. Finally, a layer of 26 gauge galvanized steel sheet 2 and 0.025 inch aluminum sheet 1 covers the rest. There are many acceptable combinations of these materials. The thickness of the panel is about 2⅞ inches. However, panels can be made in any common construction size or custom sizes to fit particular applications. These panels are used to retrofit an existing room into a SCIF.

Retrofit a Room or Structure:

Using the panels 20 above, the retrofit consists of using standard type metal framing material. The panels 20 are inserted into the framing material or applied to the outside of an existing wall. When using framing material, the panels 20 are slid into the metal framing studs, building a wall section by section.

Rail System:

The skeleton sides must be straight. A C-shaped metal or Pultruded fiberglass rod, about 1½ by ¼ inches, is attached to the ends of the skeleton, which in turn is attached to a metal or Pultruded Fiberglass rail. This rail is attached to the floor. The skeleton for the rail system is built the same way as for the Mobile Modular SCIF with the exception that there is no floor section. The sides are extended to the ground keeping the same height dimensions. The side sections of the skeleton are joined together at the bottom ends by gluing them to a 2 foot rod of C-shaped metal or Pultruded fiberglass. In the case of the front 10 and back 18 section, the procedure is the same, except that the piece of rod is 8 feet long. These pieces are attached to the floor by way of a rail made out of metal or Pultruded fiberglass. The end of the skeleton is a male piece while the rail is a female piece. The male piece is then attached to the female U channel rail/track grid, which was previously bolted to the floor with standard expansion bolts suitable for use in concrete.

Door:

FIG. 8 shows a cross section of a door 12. The door 12 is made from the same materials used in the panels 20. The door 12 assembly resembles a standard hinged door such as those found in homes and offices. However, this door 12 has the same secure features of the SCIF. The doorframe is built out of either metal channel, or Pultruded Fiberglass, with carbon powder added for EMI protection. The door 12 includes a standard-type door handle and a DCID 6/9-approved lock, such as a CD XO 9 lock or better. The standard security features, including a door sweep, EMI gaskets and door pull are added to the door the same as with a standard security door; prior to assembly in mobile structures or a retrofitted door frame. When assembled, the EMI gasket mentioned above is used between the door frame and the rough opening.

Due to its construction, this innovative door 12 is less than half the weight of a standard SCIF door, does not compromise the security of the SCIF and does not require two or three people to lift and install.

Using the above-described system and materials, an organization, whether private or Government, will save a significant amount of time and money over the conventional way of building a SCIF. Of course, dimensions and examples of mounting and attachment hardware are given as an example of a particular embodiment. Numerous other variations in the orientation and location of mounting and attachment hardware are permitted. Materials, such as metal, plastic, and sound suppression panels may be substituted for other materials with comparable or superior performance properties within the scope of this disclosure.

While the invention has been described with preferred specific embodiments thereof, it will be understood that this description is intended to illustrate and not to limit the scope of the invention, which is defined by the following claims.

I claim:

1. A weather-tight, modular, disassembleable, portable and reassembleable Sensitive Compartmented Information Facility (SCIF), comprising:
   a frame, comprising a plurality of prefabricated channels;
   a plurality of prefabricated wall and ceiling panels attached to the frame, the prefabricated panels including
      a layer of expanded metal having a pair of opposing planar surfaces;
      two layers of acoustic board attached to the layer of expanded metal, where one layer of acoustic board is bonded to each of the opposing planar surfaces of expanded metal; and
      two layers of polymer sheet, with one layer of polymer sheet on each outer surface of the acoustic board; and
   a polymer gasket between each channel/panel interface, the polymer gasket including at least one strip of metal along its length, and providing a weather-tight seal between the panels and channels.

2. The modular Sensitive Compartmented Information Facility of claim 1, where the frame comprises a set of standard dimensions that fit within most offices and dwellings.

3. The modular Sensitive Compartmented Information Facility of claim 2, where the panels comprise a set of standard dimensions that match the standard dimensions of the frame.

4. The modular Sensitive Compartmented Information Facility of claim 1, further comprising a prefabricated SCIF-quality door and doorframe attached to the modular SCIF, wherein the door includes the same construction as the prefabricated wall panels.

5. The modular Sensitive Compartmented Information Facility of claim 4, further comprising a prefabricated SCIF-quality floor attached to the SCIF.

6. The prefabricated panel for a Sensitive Compartmented Information Facility of claim 1, where the polymer sheets comprise acrylonitrile butadiene styrene (ABS) plastic sheet, with one layer of ABS plastic sheet bonded to each outer surface of the acoustic board.

7. The prefabricated panel for a Sensitive Compartmented Information Facility of claim 1, where the polymer sheets comprise vinyl sheet, with one layer of vinyl sheet bonded to each outer surface of the acoustic board.

8. The prefabricated panel for a Sensitive Compartmented Information Facility of claim 1, further comprising
   two layers of galvanized steel sheet, with one layer of galvanized steel sheet on each outer surface of the acoustic board beneath the polymer sheets.

9. The prefabricated panel for a Sensitive Compartmented Information Facility of claim 1, further comprising
   two layers of aluminum sheet, with one layer of aluminum sheet on each outer surface of the acoustic board beneath the polymer sheets.

10. The prefabricated panel for a Sensitive Compartmented Information Facility of claim 6, further comprising
   two layers of vinyl sheet, with one layer of vinyl sheet on each outer surface of the ABS sheet.

11. The prefabricated panel for a Sensitive Compartmented Information Facility of claim 10, further comprising
   two layers of galvanized steel sheet, with one layer of galvanized steel sheet on each outer surface of the vinyl sheet.

12. The prefabricated panel for a Sensitive Compartmented Information Facility of claim 11, further comprising
   two layers of aluminum sheet, with one layer of aluminum sheet on each outer surface of the galvanized steel sheet.

* * * * *